(12) United States Patent
Mahler et al.

(10) Patent No.: US 10,497,694 B2
(45) Date of Patent: Dec. 3, 2019

(54) POWER SEMICONDUCTOR DEVICES AND A METHOD FOR FORMING A POWER SEMICONDUCTOR DEVICE

(71) Applicant: Infineon Technologies AG, Neubiberg (DE)

(72) Inventors: Joachim Mahler, Regensburg (DE); Guenther Kolmeder, Altdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/965,230

(22) Filed: Apr. 27, 2018

(65) Prior Publication Data
US 2018/0315744 A1 Nov. 1, 2018

(30) Foreign Application Priority Data
Apr. 28, 2017 (DE) .................. 10 2017 109 264

(51) Int. Cl.
*H01L 27/02* (2006.01)
*H01L 23/367* (2006.01)
*H01L 29/78* (2006.01)
*H01L 29/66* (2006.01)
*H01L 23/495* (2006.01)
(Continued)

(52) U.S. Cl.
CPC ........ *H01L 27/0211* (2013.01); *H01L 23/367* (2013.01); *H01L 23/49513* (2013.01); *H01L 23/49562* (2013.01); *H01L 24/32* (2013.01); *H01L 24/49* (2013.01); *H01L 24/73* (2013.01); *H01L 27/0248* (2013.01); *H01L 29/0696* (2013.01); *H01L 29/66681* (2013.01); *H01L 29/7823* (2013.01); *H01L 29/7826* (2013.01); *H01L 21/823418* (2013.01); *H01L 21/823475* (2013.01); *H01L 27/0922* (2013.01); *H01L 2224/32245* (2013.01); *H01L 2224/49175* (2013.01); *H01L 2224/73265* (2013.01); *H01L 2924/13055* (2013.01)

(58) Field of Classification Search
CPC .................................... H01L 27/0211
USPC .......................................... 257/48
See application file for complete search history.

(56) References Cited

U.S. PATENT DOCUMENTS 5,242,841 A 9/1993 Smayling et al.
5,763,934 A * 6/1998 Aiello ................. H01L 27/0203
257/500
(Continued)

OTHER PUBLICATIONS

"PROFET™+ 12V, BTS5020-2EKA, Smart High-Side Power Switch Dual Channel, 20mΩ", Infineon Technologies AG, Automotive Power, Data Sheet, Rev. 2.1, Sep. 1, 2011.

*Primary Examiner* — Igwe U Anya
(74) *Attorney, Agent, or Firm* — Murphy, Bilak & Homiller, PLLC

(57) ABSTRACT

A power semiconductor device includes a power transistor arranged in a power device region of a semiconductor substrate. The power semiconductor device further includes a first circuit arranged in a first circuit region of the semiconductor substrate. The power semiconductor device further includes a second circuit arranged in a second circuit region of the semiconductor substrate. The first circuit region is arranged at a first edge of the semiconductor substrate. The second circuit region is arranged at a second edge of the semiconductor substrate. The power device region is arranged between the first circuit region and the second circuit region.

21 Claims, 6 Drawing Sheets

(51) Int. Cl.
  *H01L 23/00*   (2006.01)
  *H01L 29/06*   (2006.01)
  *H01L 21/8234*   (2006.01)
  *H01L 27/092*   (2006.01)

(56) References Cited

U.S. PATENT DOCUMENTS

| | | | |
|---|---|---|---|
| 6,337,503 B1* | 1/2002 | Aiello | H01L 21/761 |
| | | | 257/368 |
| 6,630,857 B2* | 10/2003 | Mizuno | H03K 19/0016 |
| | | | 327/391 |
| 2015/0123740 A1* | 5/2015 | Itasaka | H03H 9/02102 |
| | | | 331/107 R |
| 2015/0270390 A1* | 9/2015 | Kaya | H01L 29/0619 |
| | | | 257/339 |
| 2017/0133308 A1* | 5/2017 | Inaba | H01L 23/3121 |
| 2018/0269200 A1* | 9/2018 | Takahashi | H01L 21/822 |

* cited by examiner

US 10,497,694 B2

POWER SEMICONDUCTOR DEVICES AND A METHOD FOR FORMING A POWER SEMICONDUCTOR DEVICE

TECHNICAL FIELD

Examples relate to concepts for semiconductor device arrangements, and in particular to power semiconductor devices, and a method for forming a power semiconductor device.

BACKGROUND

Semiconductor chips may include power switching circuits, and logic and/or sensing circuits with control functions. A large amount of heat may be generated by the power circuits of a semiconductor chip. Failure to distribute or spread the heat may lead to higher local maximum temperatures in the system. Hot spots and/or power pulses may result in device overheating and electrical failures if heat is not transferred away from the power circuits, for example.

SUMMARY

It is a demand to provide concepts for power semiconductor devices with improved heat distribution and/or increased reliability.

Some examples relate to a power semiconductor device. The power semiconductor device comprises at least one power transistor arranged in a power device region of a semiconductor substrate. The power semiconductor device further comprises a first circuit arranged in a first circuit region of the semiconductor substrate. The power semiconductor device further comprises a second circuit arranged in a second circuit region of the semiconductor substrate. The first circuit region of the semiconductor substrate is arranged at a first edge of the semiconductor substrate. The second circuit region of the semiconductor substrate is arranged at a second edge of the semiconductor substrate. The power device region is arranged between the first circuit region and the second circuit region.

Some examples relate to a further power semiconductor device. The power semiconductor device comprises one or more power device regions comprising all areas of a semiconductor substrate with current densities larger than 0.1 A per $mm^2$. A lateral area of the semiconductor substrate occupied by the one or more power device regions is at least 20% of a total lateral area of the semiconductor substrate. A minimal lateral distance between the one or more power device regions and a first edge of the semiconductor substrate is at least 10% of a lateral length of the first edge of the semiconductor substrate. A minimal lateral distance between the one or more power device regions and a second edge of the semiconductor substrate is at least 10% of a lateral length of the first edge or the second edge of the semiconductor substrate.

Some examples relate to a further power semiconductor device. The power semiconductor device comprises a semiconductor substrate, a die pad, and a die attach material arranged between the semiconductor substrate and the die pad. The semiconductor substrate comprises at least one power transistor arranged in a power device region of the semiconductor substrate. The semiconductor substrate further comprises a first circuit arranged in a first circuit region of the semiconductor substrate. The semiconductor substrate further comprises a second circuit arranged in a second circuit region of the semiconductor substrate. The first circuit region of the semiconductor substrate is arranged at a first edge of the semiconductor substrate. The second circuit region of the semiconductor substrate is arranged at a second edge of the semiconductor substrate. The power device region is arranged between the first circuit region and the second circuit region.

Some examples relate to a method for forming a power semiconductor device. The method comprises forming a plurality of doping regions in a semiconductor substrate, wherein the plurality of doping regions comprises at least one doping region of a power transistor to be formed in a power device region of a semiconductor substrate, at least one doping region of a first circuit to be formed in a first circuit region of the semiconductor substrate, and at least one doping region of a second circuit to be formed in a second circuit region of the semiconductor substrate. The power transistor to be formed is configured to conduct at least a part of a total current between two terminals of the power semiconductor device in a conducting state of the power transistor, wherein the total current conducted between the two terminals of the power semiconductor device through the power device region is at least 250 mA in the conducting state of the power transistor. The first circuit to be formed is configured so that a maximal current conducted by the first circuit is less than 100 mA during the conducting state of the power transistor. The second circuit to be formed is configured so that a maximal current conducted by the second circuit is less than 100 mA during the conducting state of the power transistor. The first circuit region of the semiconductor substrate is arranged at a first edge of the semiconductor substrate. The second circuit region of the semiconductor substrate is arranged at a second edge of the semiconductor substrate. The power device region is arranged between the first circuit region and the second circuit region. The method further comprises forming two terminals connected to the at least one power transistor.

Those skilled in the art will recognise additional features and advantages upon reading the following detailed description, and upon viewing the accompanying drawings.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
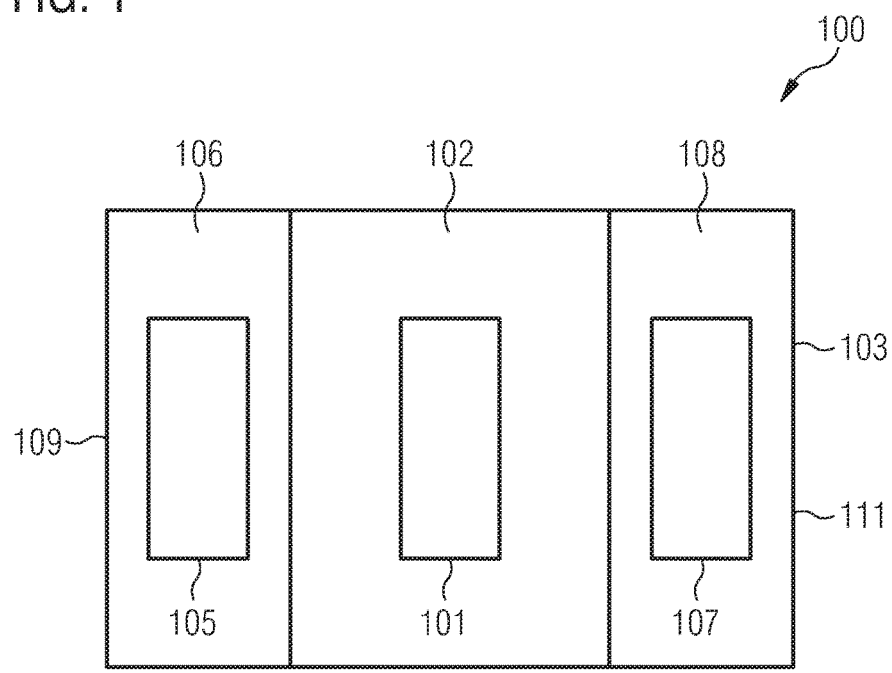
FIG. 1 shows a schematic illustration of a power semiconductor device.

FIG. 1 shows a schematic illustration of a power semiconductor device 100. For example, FIG. 1 shows a schematic illustration of a top view of the power semiconductor device 100.

The power semiconductor device 100 comprises at least one power transistor 101 arranged in a power device region 102 of a semiconductor substrate 103. The power semiconductor device 100 further comprises a first circuit 105 arranged in a first circuit region 106 of the semiconductor substrate 103. The power semiconductor device 100 further comprises a second circuit 107 arranged in a second circuit region 108 of the semiconductor substrate 103. The first circuit region 106 of the semiconductor substrate 103 is arranged at a first edge 109 of the semiconductor substrate 103. The second circuit region 108 of the semiconductor substrate 103 is arranged at a second edge 111 of the semiconductor substrate 103. The power device region is arranged between the first circuit region 106 and the second circuit region 108.

Due to the power device region being arranged (or located) between the first circuit region 106 and the second circuit region 108, heat spreading and/or heat dissipation from the power device region 102 of the semiconductor substrate may be improved. For example, the first circuit region 106 and the second circuit region may be used as heat capacitors and/or heat spreaders which may allow higher operation temperatures of the power semiconductor device 100. Due to improved heat spreading and/or heat dissipation away from the power device region 102 by the first circuit region 106 and the second circuit region 108, reliability of the power semiconductor device 100 may be improved, for example.

The power semiconductor device 100 may include at least one power transistor 101 (e.g. one or more power transistors 101, or e.g. a plurality of transistor cells) arranged in the power device region 102 of the semiconductor substrate 103. The at least one power transistor 101 may be connected between two terminals of the power semiconductor device 100. For example, in the case of a plurality of power transistors 101 arranged in the power device region 102, the power transistors 101 may be connected in parallel (or alternatively in series) between the two terminals of the power semiconductor device 100. Each power transistor 101 of the plurality of power transistors 101 may be configured to conduct at least a part of a total current between the two terminals of the power semiconductor device 100 when the plurality of transistors are in a conducting state (e.g. an on-state). The power transistor 101 may be configured to conduct at least a part of a total current between two terminals of the power semiconductor device 100 in a conducting state of the power transistor 101. The total current conducted between the two terminals of the power semiconductor device 100 through the power device region 102 may be at least 250 mA in the conducting state of the power transistor 101. The total current conducted between the two terminals of the power semiconductor device 100 through the power device region 102 may refer to a summation (or sum) of the current conducted by (or flowing through) each of the power transistors 101 connected to (or between) the two terminals of the power semiconductor device 100. In the case of there being only one power transistor 101 arranged in the power device region 102, the single power transistor 101 may conduct the total current between the two terminals of the power semiconductor device. The total current conducted between the two terminals of the power semiconductor device 100 through the power device region 102 may be at least 250 mA (or e.g. at least 500 mA, or e.g. at least 750 mA, or e.g. at least 1 A, or e.g. at least 10 A. or e.g. between 10 A and 50 A) in the conducting state of the power transistor 101.

A first terminal of the two terminals of the power semiconductor device 100 may be a voltage supply (Vs) terminal configured to provide a supply voltage to the power semiconductor device 100. The first terminal of the two terminals of the power semiconductor device 100 may be connected (e.g. directly connected) to the first source/drain region of the power transistor 101. A second terminal of the two terminals of the power semiconductor device 100 may be an output (Out0) terminal. The output terminal may be connected (e.g. directly connected) to the second source/drain region of the power transistor 101.

The at least one power transistor 101 may be configured such that at least part of the total current conducted through the at least one power transistor is provided 101 to the output terminal of the power semiconductor device. The current provided at the output terminal may be a current (IDS) conducted between the first source/drain region and the second source/drain region of the power transistor 101. The total current conducted between the two terminals may be the total current conducted through the power transistor 101 between the voltage supply (Vs) terminal and the output (Out0) terminal or from the voltage supply (Vs) terminal to the output (Out0) terminal. Optionally or additionally, the total current conducted between the two terminals may be a summation (or sum) of the total current conducted through the plurality of power transistors 101 arranged in the power device region 102 between the voltage supply (Vs) terminal and the output (Out0) terminal or from the voltage supply (Vs) terminal to the output (Out0) terminal.

Optionally, the power device region 102 of the semiconductor substrate 103 may be the only region of the semiconductor substrate 103 comprising at least one power transistor. For example, power transistors are not arranged anywhere else in the semiconductor substrate 103 except in the power device region 102.

Additionally or optionally, the power device region 102 may include all areas of a semiconductor substrate 103 with current densities larger than 0.1 A per $mm^2$ (or e.g. larger than 0.2 A per $mm^2$, or e.g. larger than 0.3 A per $mm^2$, or e.g. larger than 0.5 A per $mm^2$).

Additionally, alternatively or optionally, the semiconductor substrate 103 may include one or more (e.g. a plurality of) power device regions. For example, the power semiconductor device 100 may further include at least one power transistor arranged in a second power device region of the semiconductor substrate 103. The power transistor arranged in the second power device region may be configured to conduct at least a part of a total current between two terminals of the power semiconductor device in a conducting state of the power transistor arranged in the second power device region. The total current conducted between the two terminals of the second power semiconductor device through the power device region may be at least 250 mA (or e.g. at least 500 mA, or e.g. at least 750 mA, or e.g. at least 1 A, or e.g. at least 10 A. or e.g. between 10 A and 50 A) in the conducting state of the power transistor.

The two terminals may be the voltage supply (Vs) terminal and a second output (Out 1) terminal. For example, the first terminal of the two terminals connected to the second power device region may be connected (e.g. directly connected) to a first source/drain region of the power transistor arranged in the second power device region. A second terminal of the two terminals of connected to the second power device region may be the second output (Out1) terminal. The second output terminal may be connected (e.g. directly connected) to the second source/drain region of the power transistor arranged in the second power device region.

A minimal (or smallest) lateral distance between the first power device region 102 and the second power device region may be at least 10 µm (or e.g. at least 50 µm, or e.g. at least 100 µm). For example, a minimum lateral distance between a source/drain region of a power transistor arranged in the first power device region 102 and a source/drain region of a (closest or nearest) power transistor arranged in the second power device region may be at least 10 µm (or e.g. at least 50 µm, or e.g. at least 100 µm).

The conducting state of the power transistor 101 may refer to an on-state of the power transistor 101. For example, the conducting state of the power transistor 101 may be achieved by a gate control signal being provided to a gate of the power transistor 101. For example, the gate control signal may be a voltage signal provided to the gate of the power transistor 101 which may induce a conductive channel in a body region between the first source/drain region and a drift region of the power transistor 101. The conductive channel may be formed in a part of the body region adjacent to the gate of the power transistor 101 and a current flow may occur between the first source/drain region of the power transistor 101 and the drift region through the induced conductive channel.

The maximal current conducted by the first circuit 105 and the second circuit 107 respectively may be the maximal (or largest or total) current conducted in the individual circuit components and/or electrical interconnects (e.g. electrical wiring) of the first circuit 105 and the second circuit 107 respectively, during the conducting state of the at least one power transistor 101. Additionally, alternatively or optionally, the maximal current conducted by the first circuit (105) may be a current conducted by the first circuit (105) between two terminals (e.g. between a ground terminal and an internal or external voltage supply terminal) of the power semiconductor device during the conducting state of the power transistor (101). Additionally or optionally, the maximal current conducted by the second circuit (107) may be a current conducted by the second circuit (107) between two terminals (e.g. between a ground terminal and an internal or external voltage supply terminal) of the power semiconductor device during the conducting state of the power transistor (101).

During the conducting state of the power transistor 101, a maximal current conducted by the first circuit 105 and the second circuit 107 respectively may be lower than a maximal current conducted by the at least one power transistor 101. Additionally, alternatively or optionally, the first circuit 105 may be configured so that a maximal (or largest) current conducted by the first circuit 105 may be less than 50% (or e.g. less than 40%, or e.g. less than 30%, or e.g. less than 20%) of a maximal (or largest) current conducted by the at least one power transistor 101 during the conducting state of the power transistor 101. For example, the first circuit 105 may be configured so that a maximal (or largest) current conducted by the first circuit 105 may be less than 100 mA (or e.g. less than 80 mA, or e.g. less than 50 mA) during the conducting state of the power transistor 101. Additionally, the second circuit 107 may be configured so that a maximal (or largest) current conducted by the second circuit 107 may be less than 50% (or e.g. less than 40%, or e.g. less than 30%, or e.g. less than 20%) of a maximal (or largest) current conducted by the at least one power transistor 101 during the conducting state of the power transistor 101. For example, the second circuit 107 may be configured so that a maximal (or largest) current conducted by the second circuit 107 may be less than 100 mA (or e.g. less than 80 mA, or e.g. less than 50 mA) during the conducting state of the power transistor 101.

A breakdown voltage of transistors arranged in the first circuit region 106 and in the second circuit region 108 may be less than 10 V (or e.g. less than 8 V, or e.g. less than 5 V). For example, the breakdown voltage of each transistor of the first circuit 105 and of the second circuit 107 may be less than 10 V (or e.g. less than 8 V, or e.g. less than 5 V).

The first circuit 105 and the second circuit 107 may each include at least one of a gate control circuit and a sensor circuit. For example, the first circuit 105 and the second circuit 107 may each include at least part of a gate control circuit and a sensor circuit. The gate control circuit may be configured to generate a gate control signal (e.g. a gate voltage) of the power transistor 101. The gate control signal may be used for controlling and/or switching the power transistor 101 on (or off). The gate control signal may be generated by the first circuit 105 and/or the second circuit 107. The sensor circuit may be configured to generate a sensor signal indicating a sensed on-chip parameter (e.g. temperature and/or current). The sensor signal may control a gate voltage to be provided to the power transistor 101. The sensor signal may be generated by the first circuit 105 and/or the second circuit 107. Additionally or optionally, the first circuit 105 and the second circuit 107 may each include at least part of a control and protection circuit.

Optionally, the first circuit 105 and the second circuit 107 may have identical (e.g. the same) circuit components. For example, the first circuit 105 and the second circuit 107 may each include at least one of the following circuit components: an internal power supply circuit, an ESD protection circuit, a driver logic circuit, a gate control and charge pump circuit, a voltage sensor circuit, an over temperature circuit, a clamp for inductive load circuit, an over current switch limit circuit, a load current sense and open load detection circuit, and a forward voltage drop detection circuit.

Optionally or alternatively, the second circuit 107 may include all the sensor circuits (e.g. sensor components) of the power semiconductor device 100. For example, the second circuit 107 may include a voltage sensor circuit, an over temperature circuit, a clamp for inductive load circuit, an over current switch limit circuit, a load current sense and open load detection circuit, and/or a forward voltage drop detection circuit. Additionally, the first circuit 105 may include an internal power supply circuit, an ESD protection circuit, a driver logic circuit and/or a gate control and charge pump circuit, without sensor components (e.g. without the sensor components of the second circuit 107).

Additionally or optionally, the power semiconductor device 100 may include further circuit regions. For example, the power semiconductor device 100 may include a third circuit arranged in a third circuit region of the semiconductor substrate. Additionally or optionally, the power semiconductor device may include a fourth circuit arranged in a fourth circuit region of the semiconductor substrate.

The third circuit may be configured so that a maximal current conducted by the third circuit is less than 100 mA during the conducting state of the power transistor. The fourth circuit may be configured so that a maximal current conducted by the fourth circuit is less than 100 mA during the conducting state of the power transistor. The gate control circuit and/or sensor circuit of the power semiconductor device 100 may be arranged in the first circuit region 106, and the second circuit region 108, (and optionally the third circuit region and the fourth circuit region). For example, the circuit components of the gate control circuit and/or sensor circuit of the power semiconductor device 100 may be distributed (or divided) to the first circuit region 106 and the second circuit region 108 (and optionally to the third circuit region and the fourth circuit region as well). For example, the first circuit 105 and the second circuit 107 (and additionally or optionally the third circuit and the fourth circuit) may each be sub-circuits of the same logic, control and/or sensor circuit of the power semiconductor device 100.

Additionally or optionally, all transistors of the semiconductor device 100 having a breakdown voltage of less than 10 V may be arranged outside the power device region 102 of the semiconductor substrate 103. For example, all transistors of the semiconductor device 100 having a breakdown voltage of less than 10 V may be arranged in at least one of the first circuit region 106 of the semiconductor substrate 103 and the second circuit region 108 of the semiconductor substrate 103 (and additionally or optionally, in the third circuit region and the fourth circuit region).

The power semiconductor device 100 may further include an (e.g. at least one) electrical line (e.g. an electrical interconnect or electrically conductive layer) extending over (or through) the power device region 102 of the semiconductor substrate 103 to connect the first circuit 105 arranged in the first circuit region 106 to the second circuit 107 arranged in the second circuit region 108. The at least one electrical line may be electrically insulated from the at least one power transistor 101 within the power device region 102.

The first circuit region 106 of the semiconductor substrate 103 may be arranged directly adjacent to the power device region 102 of the semiconductor substrate 103 and directly adjacent to the first edge 109 of the semiconductor substrate 103. For example, the first circuit region 106 may extend from the power device region 102 to the first edge 109 of the semiconductor substrate 103. For example, a maximal (or largest) distance between a source/drain doping region of a transistor of the first circuit arranged in the first circuit region 106 and a source/drain doping region of a (nearest or closest) power transistor 101 arranged in the power device region 102 may be less than 10 µm (or e.g. less than 5 µm, or e.g. less than 2 µm). For example, a maximal (or largest) dimension of unused substrate material of the semiconductor substrate 103 (in which no circuits are formed) between the first circuit region 106 and the power device region 102 may be less than 10 µm (or e.g. less than 5 µm, or e.g. less than 2 µm). Additionally or optionally, a maximal (or largest) distance between the first edge of the semiconductor substrate 103 and a source/drain doping region of a transistor (closest to and/or directly adjacent to the first edge) arranged in the first circuit region 106 may be less than 10 µm (or e.g. less than 5 µm, or e.g. less than 2 µm).

The second circuit region 108 of the semiconductor substrate 103 may be arranged directly adjacent to the power device region 102 of the semiconductor substrate 103 and directly adjacent to the second edge 111 of the semiconductor substrate 103. For example, the second circuit region 108 may extend from the power device region 102 to the second edge 111 of the semiconductor substrate 103. For example, a maximal (or largest) distance between a source/drain doping region of a transistor of the second circuit arranged in the second circuit region 108 and a source/drain doping region of a (nearest or closest) power transistor 101 arranged in the power device region 102 may be less than 10 µm (or e.g. less than 5 µm, or e.g. less than 2 µm). For example, a maximal (or largest) dimension of unused substrate material of the semiconductor substrate 103 (in which no circuits are formed) between the second circuit region 108 and the power device region 102 may be less than 10 µm (or e.g. less than 5 µm, or e.g. less than 2 µm). Additionally or optionally, a maximal (or largest) distance between the second edge of the semiconductor substrate 103 and a source/drain doping region of a transistor (closest to and/or directly adjacent to the second edge) arranged in the second circuit region may be less than 10 µm (or e.g. less than 5 µm, or e.g. less than 2 µm).

The third circuit region of the semiconductor substrate may be arranged between the power device region 102 of the semiconductor substrate 103 and the third edge of the semiconductor substrate 103. For example, the third circuit region may extend from the power device region 102 to the third edge of the semiconductor substrate 103. For example, the third circuit region of the semiconductor substrate 103 may be arranged directly adjacent to the power device region 102 of the semiconductor substrate 103 and directly adjacent to the third edge of the semiconductor substrate 103. For example, a maximal (or largest) distance between a source/drain doping region of a transistor of the third circuit arranged in the third circuit region and a source/drain doping region of a power transistor 101 arranged in the power device region 102 may be less than 10 μm (or e.g. less than 5 μm, or e.g. less than 2 μm). For example, a maximal (or largest) dimension of unused substrate material of the semiconductor substrate 103 (in which no circuits are formed) between the third circuit region and the power device region 102 may be less than 10 μm (or e.g. less than 5 μm, or e.g. less than 2 μm). Additionally or optionally, a maximal (or largest) distance between the third edge of the semiconductor substrate 103 and a source/drain doping region of a transistor (closest to and/or directly adjacent to the third edge) arranged in the third circuit region may be less than 10 m (or e.g. less than 5 μm, or e.g. less than 2 μm).

The fourth circuit region of the semiconductor substrate may be arranged between the power device region 102 of the semiconductor substrate 103 and the fourth edge of the semiconductor substrate. For example, the fourth circuit region may extend from the power device region 102 to the fourth edge of the semiconductor substrate 103. For example, the fourth circuit region of the semiconductor substrate 103 may be arranged directly adjacent to the power device region 102 of the semiconductor substrate 103 and directly adjacent to the fourth edge of the semiconductor substrate 103. For example, a maximal (or largest) distance between a source/drain doping region of a transistor of the fourth circuit arranged in the fourth circuit region and a source/drain doping region of a power transistor 101 arranged in the power device region 102 may be less than 10 μm (or e.g. less than 5 μm, or e.g. less than 2 μm). For example, a maximal (or largest) dimension of unused substrate material of the semiconductor substrate 103 (in which no circuits are formed) between the fourth circuit region and the power device region 102 may be less than 10 μm (or e.g. less than 5 μm, or e.g. less than 2 μm). Additionally or optionally, a maximal (or largest) distance between the fourth edge of the semiconductor substrate 103 and a source/drain doping region of a transistor (closest to and/or directly adjacent to the fourth edge) arranged in the fourth circuit region may be less than 10 μm (or e.g. less than 5 μm, or e.g. less than 2 μm)

Additionally or optionally, the first circuit region 106 the second circuit region 108, the third circuit region and the fourth circuit region may laterally surround the power device region 102 (in a top view of the power semiconductor device 100). For example, the first circuit region 106, the second circuit region 108, the third circuit region and the fourth circuit region may occupy the lateral areas (or regions) of semiconductor substrate 103 surrounding (e.g. around) the power device region 102.

Optionally or alternatively, the semiconductor substrate 103 may include a first edge termination region instead of the third circuit region. Additionally, optionally, or alternatively, the semiconductor substrate 103 may include a second edge termination region instead of the fourth circuit region.

The first edge termination region may be arranged between the power device region 102 of the semiconductor substrate 103 and the third edge of the semiconductor substrate 103. For example, the first edge termination region may extend from the power device region 102 to the third edge of the semiconductor substrate 103. The second edge termination region may be arranged between the power device region 102 of the semiconductor substrate 103 and the fourth edge of the semiconductor substrate. For example, the second edge termination region may extend from the power device region 102 to the fourth edge of the semiconductor substrate 103. It may be that no circuits (e.g. doping regions, sensors, logic circuits, trenches and/or electrical interconnects) are arranged in the first edge termination region of the semiconductor substrate and the second edge termination region of the semiconductor substrate. For example, all electrical circuits and/or electrically conductive interconnects or layers of the power semiconductor device 100 may be arranged outside the first edge termination region and the second edge termination region.

A minimal (or smallest) lateral dimension of the first edge termination region and a minimal lateral dimension of the second edge termination region may be at least 5 times (or at least 10 times) larger than a minimal lateral dimension of an edge termination region between the first edge 109 of the semiconductor substrate 103 and the first circuit region 106. For example, the minimal lateral dimension of the first edge termination region and the minimal lateral dimension of the second edge termination region may be at least 5 times larger than a minimal lateral dimension between a source/drain region of a transistor of the first circuit arranged in the first circuit region 106 and the first edge 109 of the semiconductor substrate 103. Additionally or optionally, a minimal (or smallest) lateral dimension of the first edge termination region and a minimal lateral dimension of the second edge termination region may be at least 10% of the lateral length of the first edge 109 (or the second edge 111) of the semiconductor substrate 103.

A minimal (or smallest) lateral distance between the power device region and each edge (the first edge 109, the second edge 111, the third edge and the fourth edge) of the semiconductor substrate 103 may be at least 10% of a lateral length of the first edge 109 of the semiconductor substrate. For example, the minimal (or smallest) lateral distance between the power device region 102 and each edge of the semiconductor substrate 103 may be a minimal (or smallest) lateral distance between a source/drain doping region of the power transistor 101 of the power device region 102 and each edge of the semiconductor substrate 103. For example, the minimal (or smallest) lateral distance between the power device region 102 and each edge of the semiconductor substrate 103 may be between 100 μm and 500 μm (or e.g. between 150 μm and 450 μm, or e.g. between 200 μm and 400 μm).

For example, a minimal (or smallest) lateral distance, dp1 (see FIG. 2), between the power device region 102 and the first edge 109 of the semiconductor substrate 103 may be at least 10% (or e.g. at least 15%, or e.g. at least 20%) of a (maximal or largest) lateral length (e.g. lateral dimension) of the first edge 109 of the semiconductor substrate 103. For example, the minimal (or smallest) lateral distance between the power device region 102 and the first edge 109 of the semiconductor substrate 103 may be a minimal (or smallest) lateral distance between a source/drain doping region of the power transistor 101 of the power device region 102 and the first edge 109 of the semiconductor substrate 103.

For example, a minimal (or smallest) lateral distance, dp2 (see FIG. 2), between the power device region 102 and the second edge 111 of the semiconductor substrate 103 may be at least 10% (or e.g. at least 15%, or e.g. at least 20%) of a (maximal or largest) lateral length (e.g. lateral dimension) of the first edge 109 (and/or second edge 111) of the semiconductor substrate 103. For example, the minimal (or smallest) lateral distance between the power device region 102 and the second edge 111 of the semiconductor substrate 103 may be the minimal (or smallest) lateral distance between a source/drain doping region of the power transistor 101 of the power device region 102 and the second edge 111 of the semiconductor substrate 103.

The lateral area of the semiconductor substrate 103 occupied by the power device region 102 may occupy a central portion of the total lateral area of the semiconductor substrate 103. For example, the power device region 102 of the semiconductor substrate 103 may be (or may be arranged in) the central portion of the total lateral area of the semiconductor substrate. For example, the central portion may include a center point of the semiconductor substrate arranged at a center of the semiconductor substrate 103. A minimal lateral dimension of the central portion may be at least 20% (or e.g. between 20% and 80%, or e.g. between 20% and 70%, or e.g. between 20% and 60%) of the lateral length of the first edge 109 or the lateral length of the second edge 111 of the semiconductor substrate 103. The power device region 102 of the semiconductor substrate 103 may include the whole central portion of the semiconductor substrate 103. Alternatively or optionally, the semiconductor substrate may include at least part of the central portion of the semiconductor substrate 103 and the center point of the central portion.

The lateral area of the semiconductor substrate 103 occupied by the power device region 102 may be arranged substantially symmetrically at the center of the semiconductor substrate 103. For example, the minimal lateral distance between the power device region 102 and the first edge 109 of the semiconductor substrate 103 may differ from the minimal lateral distance between the power device region 102 and the second edge 111 of the semiconductor substrate 103 by less than 20% (or e.g. less than 10%, or e.g. less than 5%) of the minimal lateral distance between the power device region 102 and the first edge 109 of the semiconductor substrate 103. For example, the minimal lateral distance between a source/drain region of a power transistor 101 in the power device region 102 and the first edge 109 of the semiconductor substrate 103 may differ from the minimal lateral distance between the source/drain region of the power transistor 101 in the power device region 102 and the second edge 111 of the semiconductor substrate 103 by less than 20% (or e.g. less than 10%, or e.g. less than 5%) of the minimal lateral distance between the power device region 102 and the first edge 109 of the semiconductor substrate 103. Additionally or optionally, the minimal lateral distance between the power device region 102 and each edge of the semiconductor substrate 103 may differ from each other by less than 20% (or e.g. less than 10%, or e.g. less than 5%).

A breakdown voltage of the power transistor may be at least 10 V. The (or each or every) power transistor of the power semiconductor device may have a breakdown voltage (or a blocking voltage) of at least 10 V. For example, the power transistor may have a breakdown voltage or blocking voltage of more than 10V (e.g. a breakdown voltage of 10 V, 20 V or 50V), more than 100 V (e.g. a breakdown voltage of 200 V, 300) V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V).

The at least one power transistor 101 (e.g. each power transistor) may be a power metal oxide semiconductor field effect transistor (MOSFET), a double-diffused metal oxide semiconductor (DMOS) transistor or a power insulated gate bipolar transistor structure (IGBT). Optionally, if a plurality of power transistors 101 is arranged in the power device region 102, the plurality of power transistors 101 may be the same type of transistors or they may be different types of transistors.

The semiconductor substrate 103 may be a silicon-based semiconductor substrate (e.g. a silicon substrate or a silicon carbide (SiC)-based semiconductor substrate). Alternatively, or optionally, the semiconductor substrate 103 may be a gallium arsenide (GaAs)-based semiconductor substrate, or a gallium nitride (GaN)-based semiconductor substrate.

The total lateral area of the semiconductor substrate may be the whole (or entire) lateral area of a (e.g. one) lateral surface of the semiconductor substrate 103. For example, the total lateral area of the semiconductor substrate may be the lateral length of the first edge 109 of the semiconductor substrate 103 multiplied by the lateral length of a third adjacent edge of the semiconductor substrate 103. For example, a lateral area of the semiconductor substrate may be 5.626 mm×2.25 mm=12.66 mm$^2$.

The lateral surface of the semiconductor substrate 103 may be a substantially even plane (e.g. neglecting unevenness of the semiconductor structure due to the manufacturing process and trenches). For example, a minimum lateral dimension of the lateral surface of the semiconductor substrate 103 may be more than 100 times larger (or more than 1000 times or more than 10000 times) than a maximal height of structures on the main surface. The lateral surface may be substantially perpendicular (or orthogonal) to a vertical edge of the semiconductor substrate 103. For example, in comparison to a (substantially vertical or orthogonal) edge of the semiconductor substrate 103, the lateral surface may be a basically horizontal surface extending laterally. The lateral dimension of the lateral surface of the semiconductor substrate 103 may be more than 100 times larger (or more than 1000 times or more than 10000 times) than a basically vertical dimension (or height) of a vertical edge 109, 111 of the semiconductor substrate 103. A lateral dimension or lateral distance may be a dimension or distance measured in a direction substantially horizontal to the lateral surface of the semiconductor substrate 103.

The edges 109, 111 of the semiconductor substrate 103 may result from separating (e.g. dicing or cutting) the semiconductor substrate 103 of a chip from other chips. The edges of the semiconductor substrate 103 may thus be substantially perpendicular (or orthogonal) to the lateral surface of the semiconductor substrate 103. The second edge 111 of the semiconductor substrate 103 may be arranged opposite to the first edge 109 of the semiconductor substrate 103. For example, the second edge 111 of the semiconductor substrate 103 may oppositely face the first edge 109 of the semiconductor substrate 103. The third edge of the semiconductor substrate 103 may connect the first edge 109 of the semiconductor substrate 103 to the opposite second edge 111 of the semiconductor substrate 103. For example, the third edge of the semiconductor substrate 103 may be an edge orthogonal to the first edge 109 and the second edge 111 in a top view of the power semiconductor device. The fourth edge of the semiconductor substrate 103 may be arranged opposite to the third edge of the semiconductor substrate 103. For example, the fourth edge of the semiconductor substrate 103 may oppositely face the third edge of the semiconductor substrate 103. The fourth edge of the semiconductor substrate 103 may connect the first edge 109 of the semiconductor substrate 103 to the opposite second edge 111 of the semiconductor substrate 103.

Optionally, the lateral length (or dimension) of each edge of the semiconductor substrate 103 may be substantially equal to each other. Optionally or alternatively, the lateral distance between the first edge of the semiconductor substrate 103 and the second edge of the semiconductor substrate 103 may be larger than 120% (or e.g. larger than 150%, or e.g. larger than 200%) of a lateral length of the first edge 109 (and/or a lateral length of the second edge 111) of the semiconductor substrate 103. Optionally or alternatively, the lateral distance between the first edge 109 of the semiconductor substrate 103 and the second edge 111 of the semiconductor substrate 103 may be smaller than 75% (or e.g. smaller than 60%, or e.g. smaller than 50%) of a lateral length of the first edge 109 (and/or a lateral length of the second edge 111 of the semiconductor substrate 103.

A first (or front) lateral surface of the semiconductor substrate 103 may be a surface of the semiconductor substrate 103 towards metal layers, insulation layers and/or passivation layers on top of the semiconductor substrate 103 or a surface of one of these layers. For example, a semiconductor substrate 103 front side may be the side at which active elements of the chip are formed. For example, in a semiconductor substrate of some power semiconductor devices, a chip (or semiconductor substrate) front side may be a side of the chip at which a first source/drain region and a gate region are formed, and a chip (or semiconductor substrate) back side may be a side of the chip at which a second source/drain region is formed. For example, more complex structures may be arranged at the chip front side than at the chip back side.

The back side (e.g. a back lateral surface) of the semiconductor substrate 103 may be attached to a carrier (e.g. a die pad) via an adhesive material (e.g. a die attach material). The adhesive material may be in contact with the back side of the semiconductor substrate 103 over at least the (entire) lateral area of the power device region 102 and over less than the total lateral area of the semiconductor substrate 103.

The lateral area of the semiconductor substrate 103 occupied by the power device region 102) may refer to the amount of surface area (from a top view) taken up by the at least one power transistor 101 arranged in the power device region 102. For example, the lateral area of the semiconductor substrate 103 occupied by the power device region 102 may be at least or more than 20% (or e.g. between 20% and 80%, or e.g. between 30% and 70%, or e.g. between 40% and 70%, or e.g. more than 40%, or e.g. more than 50%, or e.g. more than 60%, or e.g. more than 70%) of a total lateral area of the semiconductor substrate 103.

The various examples described herein may relate to a monolithic semiconductor device with a DMOS/power switch and further functionalities like logic and/or sensors. The DMOS area may be more or less symmetrically arranged in the chip center and the logic/sensor areas around may be intrinsically used as heat capacitors and/or spreaders for improved reliability and higher operation temperatures.

The various examples may include semiconductor chips with multi-functionalities. For example, the semiconductor chips may perform or include power switching (DMOS, Power) and logic, sensing or other control functions for the power supply. The various examples may also relate to systems such as SMART technology. The various examples address important issues such as the heat transfer out from the chip, e.g. by the chip bottom by the die attach and/or the lead frame and/or the chip carrier, and head spreading during the device operation. For example, heat distribution to a larger volume may be used to decrease the local maximum temperatures in the system. In both cases, a major part of the heat may be generated by the DMOS power structure. The various examples describe a simple chip design to spread the heat of the DMOS area in an improved way by the logic or sensor area. Thus, a decreased maximum temperature of the system and therefore an improved reliability may be achieved.

Heat dissipation length L (speeds) of different materials with the temperature conductivity, shows that silicon as the semiconductor material may be as similarly effective as Cu, and that even longer power pulse times of up to 0.1 s may be easily dissipated inside the silicon material around the power/heat source (DMOS). For example, the heat dissipation length of silicon may be better than that of mold compounds. Thus, if the DMOS/Power area is arranged next to the chips edges (and close to the molding compound) and there are hot spots/some power pulses in the sub seconds range, the heat diffusion of the molding compound may be insufficient to transfer out the heat form the DMOS, resulting in device overheating and electrical failures due to this.

The various examples include chip designs which focus on functionality integration on the chip level by considering the bonding of the chip to leads by the wire-bond process in the backend. The logic/sensor area may be in one part and the Power/DMOS area may be in another part of the chip area. The DMOS area (power device region may be more or less symmetrically arranged in the center of the die. This may avoid heating problems associated with the DMOS/Power area being more or less at the chip edges, which are caused by the logic/sensor areas being unable to act as heat spreaders or heat dissipaters for the DMSO/Power switch in this area. In addition, partially missing conductive die-attach material in the DMSO/Power area may result in device overheating and due to this, an electrical failure during device operation. If the heat sensitive area (e.g. the power device region) is more or less no longer arranged at the chip edges, the semiconductor area/material there may act as a heat spreader, and the missing die attach material in these areas do not result in an electrical failure. It may be difficult to achieve complete coverage of the die attach material. Insufficient (and/or missing) die attach material below the logic/sensor areas, where the heat dissipation has to be only minor, may be allowed. However, this may result in other reliability issues like molding compound underflow and chip delamination (and/or cracks).

The various examples provide improved heat dissipation and/or spreading and reliability for power devices with further functionalities on the chip like logic and sensors, with additional reduced risk of overheating during operation for SMART devices. In addition, using larger chip sizes, which may lead to increased silicon and packaging costs, may be avoided, for example.

Figure 2:
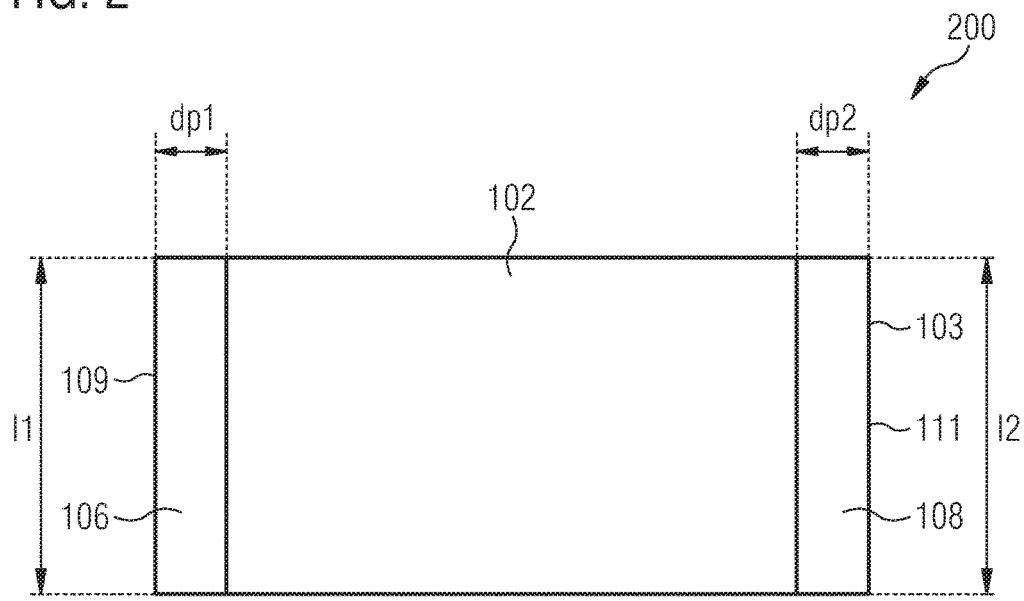
FIG. 2 shows a schematic illustration of a further power semiconductor device including a third edge being larger than the first edge.

FIG. 2 shows a schematic illustration of a power semiconductor device 200. For example, FIG. 2 shows a schematic illustration of a top view of the power semiconductor device 200 (e.g. a proposed chip).

As shown in FIG. 2, the first circuit region 106 (e.g. a first logic L circuit) of the semiconductor substrate 103 may be arranged between the power device region 102 (e.g. a DMOS region) of the semiconductor substrate 103 and the first edge 109 of the semiconductor substrate 103. Additionally, the second circuit region 108 (e.g. a second logic L circuit and/or sensor S circuit) of the semiconductor substrate 103 may be arranged between the power device region 102 of the semiconductor substrate 103 and the second edge 111 of the semiconductor substrate 103. Additionally, the power device region 102 may be arranged between the first circuit region 106 and the second circuit region 108. Additionally or optionally, a lateral area of the semiconductor substrate 103 occupied by the power device region 102 may be at least 20% of a total lateral area of the semiconductor substrate 103. For example, the DMOS/Power area 102 may be more in the center (of the semiconductor substrate 103), and may be arranged between two split logic areas, namely the first circuit region 106 and the second circuit region 108. For example, one of the split areas may be used for sensing S. For example, one of the first circuit region 106 and the second circuit region 108 may include all the sensor circuits of the power semiconductor device.

The lateral distance between the first edge 109 of the semiconductor substrate 103 and the second edge 111 of the semiconductor substrate 103 may be larger than 120% (or e.g. larger than 150%, or e.g. larger than 200%) of a lateral length of the first edge 109, 11. (and/or a lateral length of the second edge 111, 12) of the semiconductor substrate 103. For example, a lateral length of a third edge (and/or a fourth edge) of the semiconductor substrate 103 may be larger than the lateral length of the first edge 109 (and/or a lateral length of the second edge 111) of the semiconductor substrate 103.

More details and aspects are mentioned in connection with the examples described above or below. The examples shown in FIG. 2 may comprise one or more optional additional features corresponding to one or more aspects mentioned in connection with the proposed concept or one or more examples described above (e.g. FIG. 1) or below (FIGS. 3 to 9).

Figure 3:
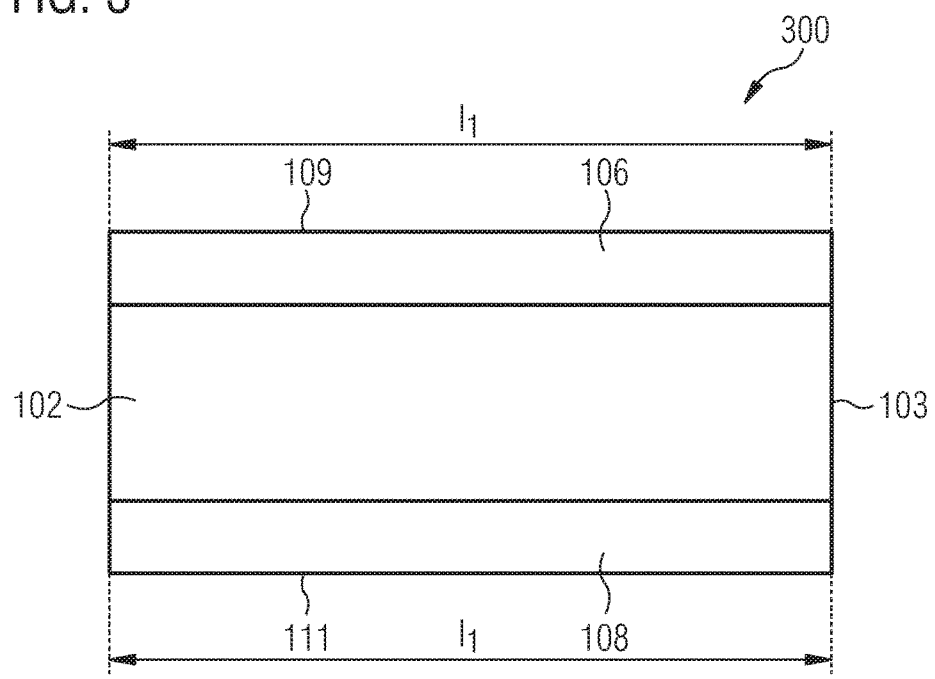
FIG. 3 shows a schematic illustration of a further power semiconductor device including a third edge being smaller than a first edge.

FIG. 3 shows a schematic illustration of a power semiconductor device 300. For example, FIG. 3 shows a schematic illustration of a top view of the power semiconductor device 300.

As shown in FIG. 3, the first circuit region 106 (e.g. a first logic circuit) of the semiconductor substrate 103 may be arranged between the power device region 102 (e.g. a DMOS region) of the semiconductor substrate 103 and the first edge 109 of the semiconductor substrate 103. Additionally, the second circuit region 108 (e.g. a second logic circuit and/or sensor circuit) of the semiconductor substrate 103 may be arranged between the power device region 102 of the semiconductor substrate 103 and the second edge 111 of the semiconductor substrate 103. Additionally, the power device region 102 may be arranged between the first circuit region 106 and the second circuit region 108.

The power semiconductor device 300 may be similar to the semiconductor device described in connection with FIGS. 1 to 2. However, the lateral distance between the first edge 109 of the semiconductor substrate 103 and the second edge 111 of the semiconductor substrate 103 may be smaller than 75% (or e.g. smaller than 60%, or e.g. smaller than 50%) of a lateral length of the first edge 109 (and/or a lateral length of the second edge 111 of the semiconductor substrate 103. For example, a lateral length of a third edge (and/or a fourth edge) of the semiconductor substrate 103 may be smaller than the lateral length of the first edge 109, 11. (and/or a lateral length of the second edge 111, 12) of the semiconductor substrate 103.

More details and aspects are mentioned in connection with the examples described above or below. The examples shown in FIG. 3 may comprise one or more optional additional features corresponding to one or more aspects mentioned in connection with the proposed concept or one or more examples described above (e.g. FIGS. 1 or 2) or below (FIGS. 4 to 9).

Figure 4:
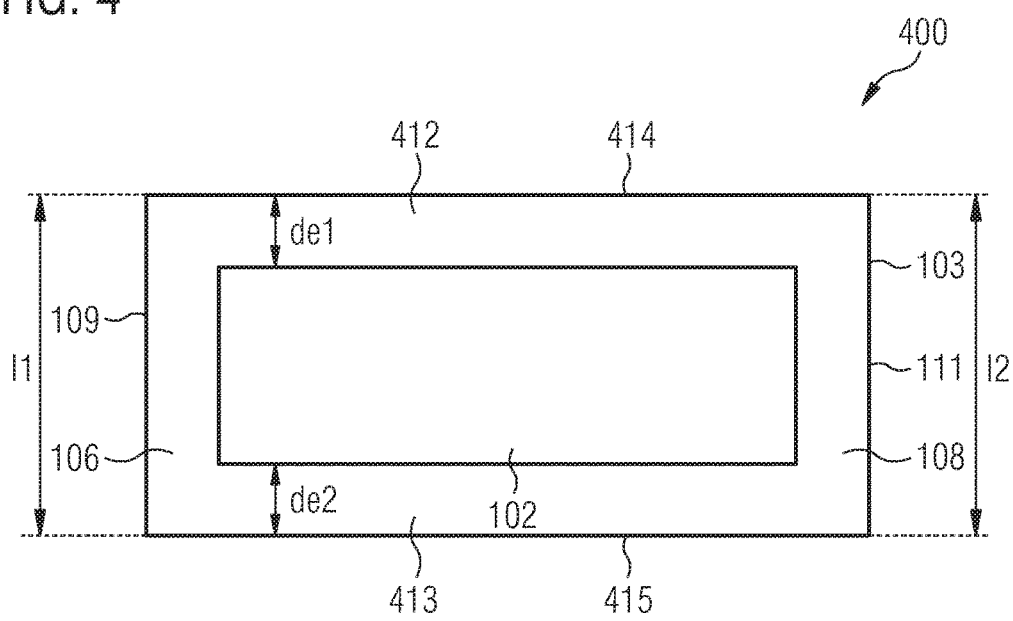
FIG. 4 shows a schematic illustration of a further power semiconductor device including a first edge termination region and a second edge termination region.

FIG. 4 shows a schematic illustration of a power semiconductor device 400. For example, FIG. 4 shows a schematic illustration of a top view of the power semiconductor device 400.

The power semiconductor device 300 may be similar to the semiconductor device described in connection with FIGS. 1 to 3.

As shown in FIG. 4, the semiconductor substrate 103 may further include a third circuit region 412 or a fourth circuit region 413. The third circuit region of the semiconductor substrate may be arranged between the power device region 102 of the semiconductor substrate 103 and the third edge of the semiconductor substrate 103. The fourth circuit region of the semiconductor substrate may be arranged between the power device region 102 of the semiconductor substrate 103 and the fourth edge of the semiconductor substrate. Additionally, the power device region 102 may be arranged between the third circuit region and the fourth circuit region.

Additionally or optionally, the first circuit region 106 the second circuit region 108, the third circuit region and the fourth circuit region may laterally surround the power device region 102 (in a top view of the power semiconductor device 400). For example, the first circuit region 106 the second circuit region 108, the third circuit region and the fourth circuit region may occupy the lateral areas of semiconductor substrate 103 surrounding (e.g. around) the power device region 102.

Alternatively, the semiconductor substrate 103 may include a first edge termination region 412 instead of the third circuit region. Additionally or optionally, the semiconductor substrate 103 may include a second edge termination region 413 instead of the fourth circuit region.

The first edge termination region 412 may be arranged between the power device region 102 of the semiconductor substrate 103 and the third edge 414 of the semiconductor substrate 103. The second edge termination region 413 may be arranged between the power device region 102 of the semiconductor substrate 103 and the fourth edge 415 of the semiconductor substrate 103.

A minimal (or smallest) lateral dimension, de1, of the first edge termination region 412 and a minimal lateral dimension, de2, of the second edge termination region 413 may be at least 5 times (or at least 10 times) larger than a minimal lateral dimension of an edge termination region between the first edge 109 of the semiconductor substrate 103 and the first circuit region 106. For example, the minimal lateral dimension of the first edge termination region 412 and the minimal lateral dimension of the second edge termination region 413 may be at least 5 times larger than a minimal lateral dimension between a source/drain region of a transistor of the first circuit arranged in the first circuit region 106 and the first edge 109 of the semiconductor substrate 103. Additionally or optionally, a minimal (or smallest) lateral dimension of the first edge termination region and a minimal lateral dimension of the second edge termination region may be at least 10% of the lateral length, l1, of the first edge 109 (or the lateral length, l2, second edge 111) of the semiconductor substrate 103. For example, a minimal (or smallest) lateral dimension of the first edge termination region and a minimal lateral dimension of the second edge termination region may be between 100 μm and 500 μm (or e.g. between 150 μm and 450 μm, or e.g. between 200 μm and 400 μm).

The first edge termination region 412 and the second edge termination region 413 may be non-active areas. The non-active areas may be considered as a heat capacitor (e.g. for heat dissipation), with no electrical function.

More details and aspects are mentioned in connection with the examples described above or below. The examples shown in FIG. 4 may comprise one or more optional additional features corresponding to one or more aspects mentioned in connection with the proposed concept or one or more examples described above (e.g. FIGS. 1 to 3) or below (FIGS. 5 to 9).

Figure 5:
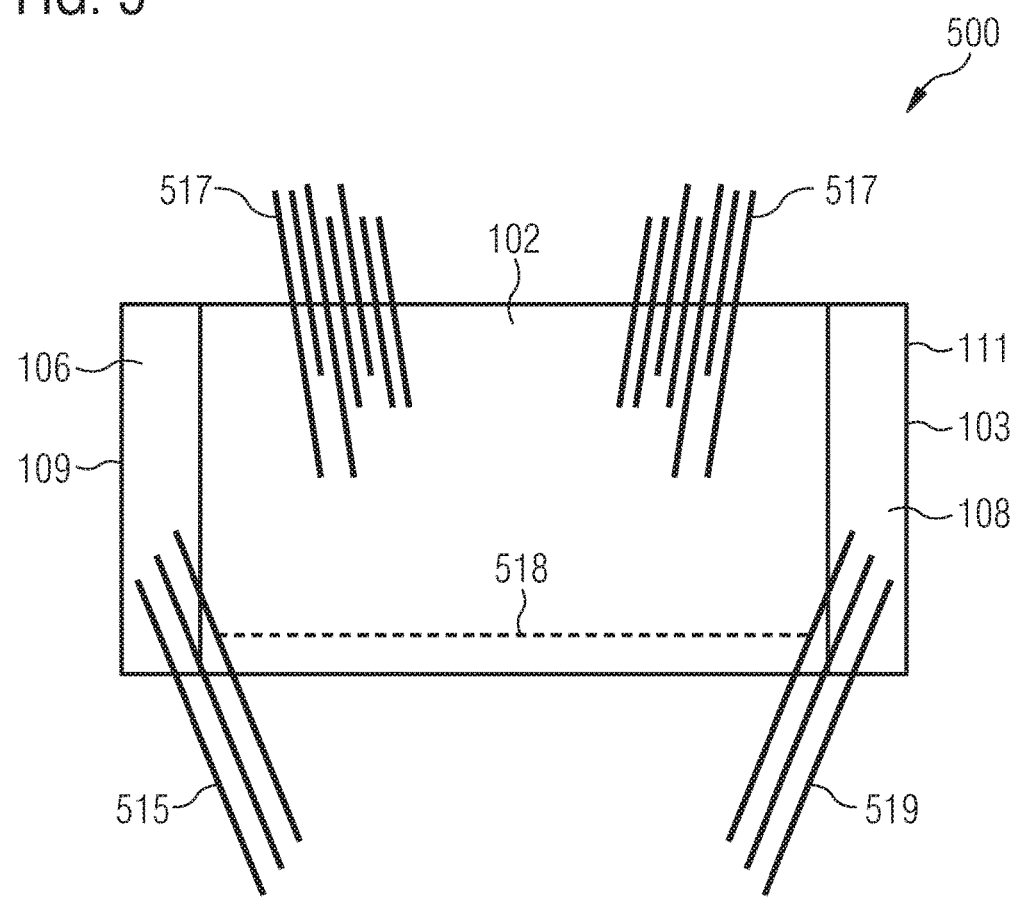
FIG. 5 shows a schematic illustration of a further power semiconductor device including at least one electrical interconnect.

FIG. 5 shows a schematic illustration of a power semiconductor device 500. For example, FIG. 5 shows a schematic illustration of a top view of the power semiconductor device 500 including possible wiring of the power semiconductor device 500).

The power semiconductor device 500 may further include at least one electrical interconnect 518 (or e.g. a plurality of electrical lines or interconnects) extending over (or through) the power device region 1 interconnect 51802 of the semiconductor substrate 103. The at least one electrical interconnect 518 may connect the first circuit arranged in the first circuit region 106 to the second circuit arranged in the second circuit region 108. At least part of the at least one electrical interconnect 518 may be a metal layer (e.g. a wiring or connection line) formed in or within the semiconductor substrate 103. The at least one electrical interconnect 518 may be electrically insulated from the at least one power transistor within the power device region 102. The at least one electrical line 518 may be (or may include) one or more connection layers among the first logic area (e.g. the first circuit region 106) and the second logic area (e.g. the second circuit region 108) which is separated from the first logic area. The connection layers may be realized by the chip layout.

The (or each) electrical interconnect 518 may connect one or more circuit components of the first circuit arranged in the first circuit region 106 to at least one or more circuit components of the second circuit arranged in the second circuit region 108. For example, the one or more circuit components of the first circuit and the one or more circuit components of the second circuit may be connected via the electrical interconnect 518 to form a gate control circuit configured to generate a gate control signal for controlling a gate voltage of the power transistor in the power device region 102. Optionally, the one or more circuit components of the first circuit and the one or more circuit components of the second circuit may be different components from each other. For example, the first circuit 105 and the second circuit 107 may each be sub-circuits of the same logic, control and/or sensor circuit of the power semiconductor device 100.

Alternatively or optionally, the second circuit 107 may include all the sensor circuits (e.g. sensor components) of the power semiconductor device 600. For example, the one or more circuit components of the first circuit may include gate control components or logic components. For example, the first circuit may include an internal power supply circuit, an electrostatic discharge (ESD) protection circuit, a driver logic circuit and/or a gate control and charge pump circuit. The second circuit may include a voltage sensor circuit, an over temperature circuit, a clamp for inductive load circuit, an over current switch limit circuit, a load current sense and open load detection circuit, and/or a forward voltage drop detection circuit.

The power semiconductor device 500 may further include a plurality of electrical wires electrically connected (bonded) between electrical pads of the semiconductor substrate and pins a carrier (e.g. a lead frame). For example, a first group of electrical wires 517 of the plurality of electrical wires may be electrically connected to the electrical pads of the at least one power transistor of in the power device region 102. Optionally, the first group of electrical wires 517 may be 65 μm electrical wires, and may be arranged in two or three rows when connected to the power device region 102. For example, depending on the chip size, the wire bonding arrangement for the DMOS area may be kept the same or may be implemented as a three row concept. Optionally, the number of wires may be decreased based on an increase of the diameter of the wires.

A second group of electrical wires 515 of the plurality of electrical wires may be electrically connected to the electrical pads of the first circuit in the first circuit region 106 of the semiconductor substrate 103. Additionally, a third group of electrical wires 519 of the plurality of electrical wires may be electrically connected to the electrical pads of the second circuit in the circuit region 108 of the semiconductor substrate 103.

Due to the at least one electrical interconnect 518 connecting the one or more circuit components of the first circuit arranged in the first circuit region 106 to the one or more circuit components of the second circuit arranged in the second circuit region 108, the number of external pins connected to the output terminals of the power semiconductor output (e.g. the pin layout) may be the same as the number of external pins if only one circuit region (e.g. the first circuit region 106) were arranged in the semiconductor substrate 103, and if all gate control circuits and sensor circuits of the power semiconductor device were arranged in the first circuit region 106.

The area or dimensions of the power device region 102 (e.g. the DMOS area or region) may depend on whether the power device region 102 is a high ohmic or low ohmic device region. For example, the area or dimensions of the power device region may be changed (e.g. the width may be reduce and/or the length may be increased) to keep the area the same or to increase it. In addition, die pad layout changes may not be necessary.

More details and aspects are mentioned in connection with the examples described above or below. The examples shown in FIG. 5 may comprise one or more optional additional features corresponding to one or more aspects mentioned in connection with the proposed concept or one or more examples described above (e.g. FIGS. 1 to 4) or below (FIGS. 6 to 9).

Figure 6:
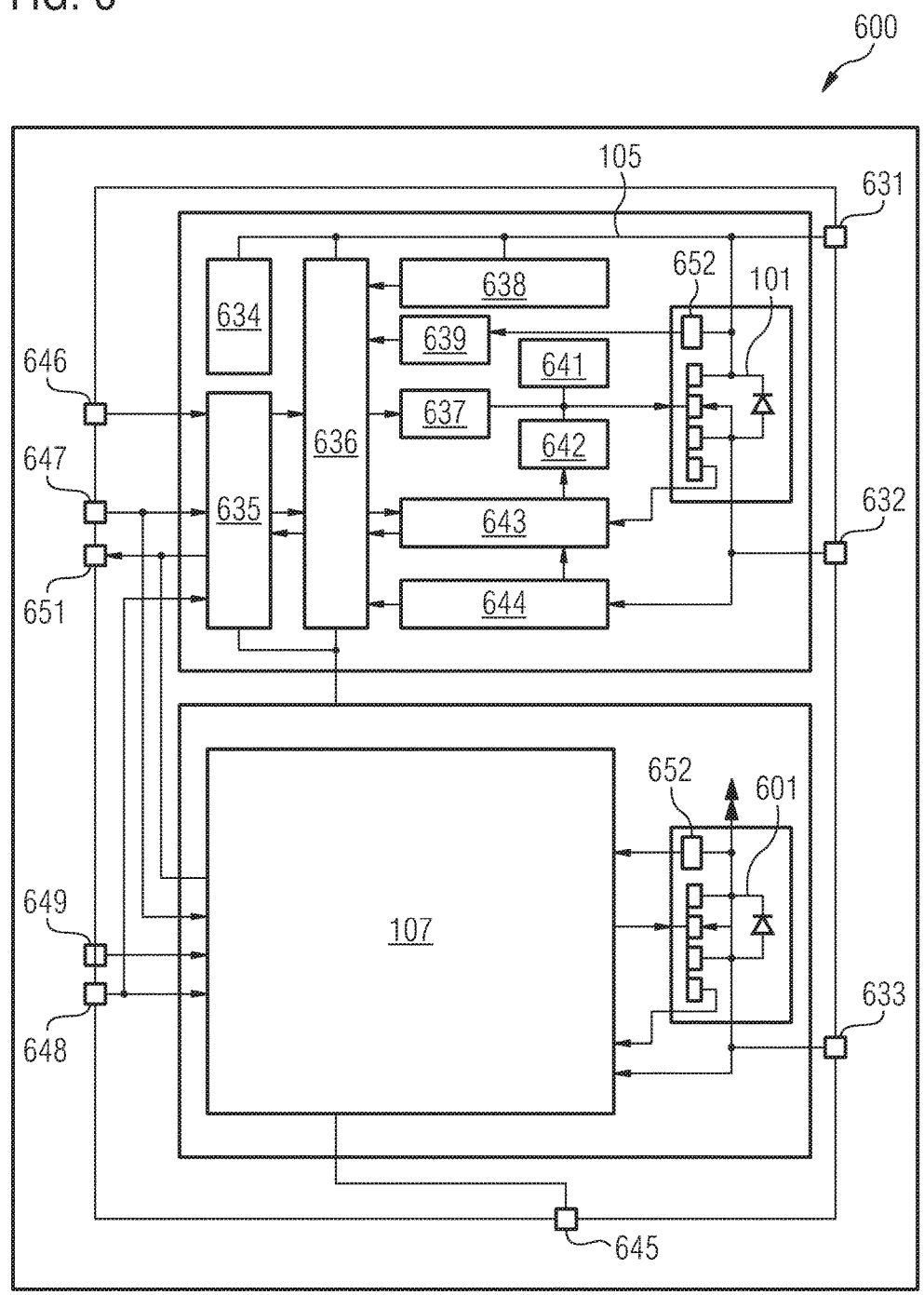
FIG. 6 shows a schematic illustration of a further power semiconductor device including a power transistor arranged in a second power device region.

FIG. 6 shows a schematic illustration of a power semiconductor device 600.

The power semiconductor device 600 may include a semiconductor substrate including a plurality of power device regions. The power semiconductor device 600 may include at least one power transistor 101 arranged in the (first) power device region of a semiconductor substrate. The power semiconductor device 600 may further include at least one power transistor 601 arranged in a second power device region of the semiconductor substrate.

The power semiconductor device 600 may further include a first circuit 105 (channel 0) arranged in a first circuit region of the semiconductor substrate. The power semiconductor device 600 may further include a second circuit 107 (channel 1) arranged in a second circuit region of the semiconductor substrate. The first circuit 105 and the second circuit 107 may each include at least one of a gate control circuit and a sensor circuit. For example, the first circuit 105 and the second circuit 107 may each include at least part of a gate control circuit and a sensor circuit. The gate control circuit may be configured to generate a gate control signal (e.g. a gate voltage) of the power transistor 101. The gate control signal may be used for controlling and/or switching the power transistor 101 on (or off). The gate control signal may be generated by the first circuit 105 and/or the second circuit 107. The sensor circuit may be configured to generate a sensor signal indicating a sensed on-chip parameter (e.g. temperature and/or current). The sensor signal may control a gate voltage to be provided to the power transistor 101. The sensor signal may be generated by the first circuit 105 and/or the second circuit 107. Additionally or optionally, the first circuit 105 and the second circuit 107 may each include at least part of a control and protection circuit.

The first circuit 105 and the second circuit 107 may each include at least one of the following circuit components: an internal power supply circuit 634, an ESD protection circuit 635, a driver logic circuit 636, a gate control and charge pump circuit 637, a voltage sensor circuit 638, an over temperature circuit 639, a clamp for inductive load circuit 641, an over current switch limit circuit 642, a load current sense and open load detection circuit 643, and a forward voltage drop detection circuit 644. The over temperature circuit 639 may be connected to a temperature sensor 652. For example, each power device region may include a temperature sensor 652 configured to measure a temperature of the power device region. Optionally, the first circuit 105 and the second circuit 107 may have identical (e.g. the same) circuit components. For example, the gate control circuit and the sensor circuit may be split between the first circuit region and the second circuit region. For example, the second circuit 107 may be or may include a control and protection circuit equivalent to channel 0 (the first circuit 105).

Optionally or alternatively, the second circuit 107 may include all the sensor circuits (e.g. sensor components) of the power semiconductor device 600. For example, the second circuit 107 may include the voltage sensor circuit 638, the over temperature circuit 639, the clamp for inductive load circuit 641, the over current switch limit circuit 642, the load current sense and open load detection circuit 643, and/or the forward voltage drop detection circuit 644. Additionally, the first circuit 105 may include the internal power supply circuit 634, the ESD protection circuit 635, the driver logic circuit 636 and/or the gate control and charge pump circuit 637, without sensor components.

The first circuit 105 may be configured so that a maximal current conducted by the first circuit 105 is less than 100 mA during the conducting state of the power transistor 101 arranged in the first power device region and/or during the conducting state of the power transistor 601 arranged in the second power device region. The maximal current may be the largest current in one electrical interconnect of the first circuit 105 during the conducting state of the power transistor 601 and/or it may be the largest current carried by all the electrical interconnects of the first circuit 105 simultaneously during the conducting state of the power transistor 601. Additionally, the second circuit 107 may be configured so that a maximal current conducted by the second circuit 107 is less than 100 mA during the conducting state of the power transistor 101 arranged in the first power device region and/or during the conducting state of the power transistor 601 arranged in the second power device region. A breakdown voltage of transistors arranged in the first circuit region 106 and in the second circuit region 108 may be less than 10 V (or e.g. less than 8 V, or e.g. less than 5 V).

The power semiconductor device 600 may include a voltage supply (Vs) terminal 631 configured to supply a voltage (e.g. a battery voltage) to the power semiconductor device 600. The voltage supply (Vs) terminal 631 may be connected (e.g. directly connected) to a cooling tab of the power semiconductor device 600. The voltage supply (Vs) terminal 631 may be connected (e.g. directly connected) to the first source/drain region of the power transistor 101 arranged in the first power device region. The power semiconductor device 600) may further include an (first) output (Out0) terminal 632 connected (e.g. directly connected) to the second source/drain region of the power transistor 101 arranged in the first power device region. Additionally, the first output terminal 632 may be connected to one or more pins (e.g. pins 12, 13, 14) of the power semiconductor device 600. Additionally or optionally, a supply voltage provided to the voltage supply terminal 631 may lie between −0.3V and 28 V. Additionally or optionally, a voltage at the power transistor VDS may be less than 41 V.

The first output terminal 632 may provide a protected high side power output from channel 0. The at least one power transistor 101 may be configured such that at least part of the total current conducted through the at least one power transistor 101 is provided to the first output terminal 632 of the power semiconductor device 600. The total current conducted between the voltage supply terminal 631 and the first output terminal 632 may be at least 250 mA (or e.g. at least 500 mA, or e.g. at least 750 mA, or e.g. at least 1 A, or e.g. at least 10 A. or e.g. between 10 A and 50 A) in the conducting state of the power transistor 101 arranged in the first power device region. For example, a current (IDS) through the power transistor may be between 40 A to 50 A.

The power semiconductor device 600 may further include a second output (Out1) terminal 633 connected (e.g. directly connected) to the second source/drain region of the power transistor 601 arranged in the second power device region. Additionally, the second output terminal 633 may be connected to one or more pins (e.g. pins 8, 9, 10) of the power semiconductor device 600.

The second output terminal 633 may provide a protected high side power output from channel 1. The voltage supply (Vs) terminal 631 may be connected (e.g. directly connected) to the first source/drain region of the power transistor 601 arranged in the second power device region. The total current conducted between the voltage supply terminal 631 and the second output terminal 633 may be at least 250 mA (or e.g. at least 500 mA, or e.g. at least 750 mA, or e.g. at least 1 A, or e.g. at least 10 A. or e.g. between 10 A and 50 A) in the conducting state of the power transistor 601 arranged in the second power device region The power semiconductor device 600 may further include a ground terminal 645 (GND) connected to the first circuit 105 and/or the second circuit 107, wherein the ground terminal 645 is configured to provide a ground connection to the first circuit 105 and/or the second circuit 107. Additionally, the ground terminal 645 may be connected to a pin (e.g. pin 1) of the power semiconductor device 600. Additionally or optionally, a current through the ground terminal 645 may lie between −10 mA and 10 mA.

The power semiconductor device 600 may further include a first input terminal 646 (e.g. input channel 0 IN0) which may be connected to the ESD protection circuit 635 of the first circuit 105. The first input terminal 646 may provide an input signal to the power semiconductor device 600 for channel 0 (first circuit 105) activation. Additionally, the first input terminal 646 may be connected to a pin (e.g. pin 2) of the power semiconductor device 600. Additionally or optionally, a voltage provided to the first input terminal 646 may lie between −0.3V and 6 V.

The power semiconductor device 600 may further include a diagnostic enable (DEN) terminal 647, which may be connected to the ESD protection circuit 635 of the first circuit 105 (and/or to the ESD protection circuit of the second circuit 107). The diagnostic enable terminal 647 may provide a digital signal to the power semiconductor device 600 to enable and/or disable the diagnosis of the power semiconductor device 600. Additionally, the diagnostic enable terminal 647 may be connected to a pin (e.g. pin 3) of the power semiconductor device 600. Additionally or optionally, a voltage provided to the diagnostic enable terminal 647 may lie between −0.3V and 6 V.

The power semiconductor device 600 may further include a sense (IS) terminal 651, which may be connected to the ESD protection circuit 635 of the first circuit 105 (and/or to the ESD protection circuit of the second circuit 107). The sense terminal 651 may carry a sense current of the selected channel (e.g. channel 0 or channel 1) from the power semiconductor device 600. Additionally, the sense terminal 651 may be connected to a pin (e.g. pin 4) of the power semiconductor device 600. Additionally or optionally, a current through the sense terminal 651 may lie between −25 mA and 50 mA.

The power semiconductor device 600 may further include a diagnostic selection (DSEL) terminal 648, which may be connected to the ESD protection circuit 635 of the first circuit 105 (and/or to the ESD protection circuit of the second circuit 107). The diagnostic selection terminal 648 may provide a digital signal to the power semiconductor device 600 to select the channel (e.g. channel 0 or channel 1) to be diagnosed. Additionally, the diagnostic selection terminal 648 may be connected to a pin (e.g. pin 5) of the power semiconductor device 600. Additionally or optionally, a voltage provided to the diagnostic selection terminal 648 may lie between −0.3V and 6 V.

The power semiconductor device 600 may further include a second input terminal 649 (e.g. input channel 1 IN1) which may be connected to the ESD protection circuit 635 of the second circuit 107. The second input terminal 649 may provide an input signal to the power semiconductor device 600 for channel 1 (second circuit 107) activation. Additionally, the second input terminal 649 may be connected to a pin (e.g. pin 6) of the power semiconductor device 600. Additionally or optionally, a voltage provided to the second input terminal 649 may lie between −0.3V and 6 V.

The terminals (e.g. pads) of the semiconductor substrate may be connected to external pins (e.g. metal leads of a lead frame) of the power semiconductor device 600. All output pins of a given channel may be connected together on a printed circuit board. All pins of an output may be internally connected together. Printed circuit board traces may be designed to withstand the maximum current which may flow. Optionally or additionally, one or more pins (e.g. pin 7, 11) of the power semiconductor device 600 are not connected to the semiconductor substrate. For example, the one or more pins may provide no internal connection to the chip.

Figure 8:
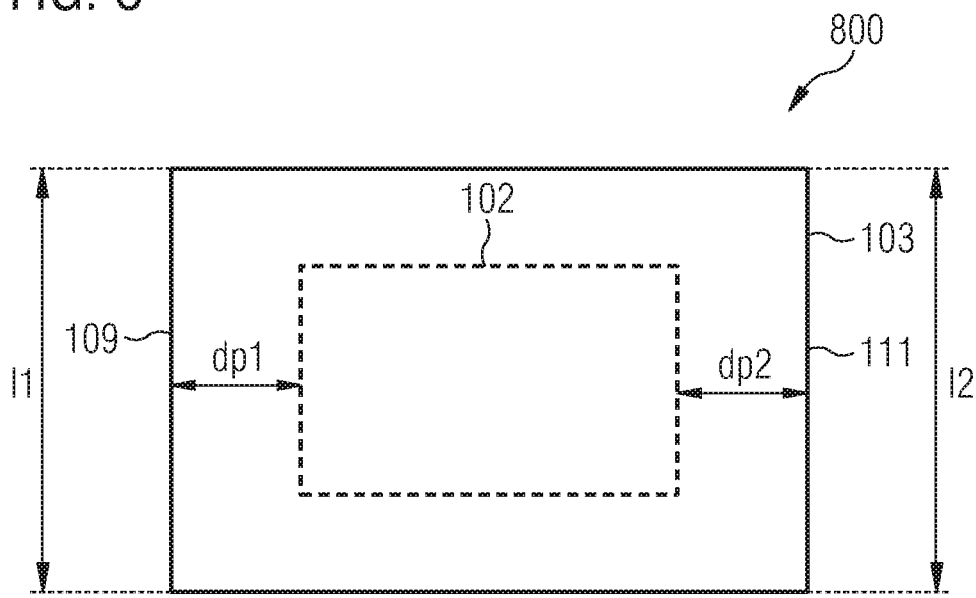
FIG. 8 shows a schematic illustration of a further power semiconductor device including one or more power device regions.
Figure 9:
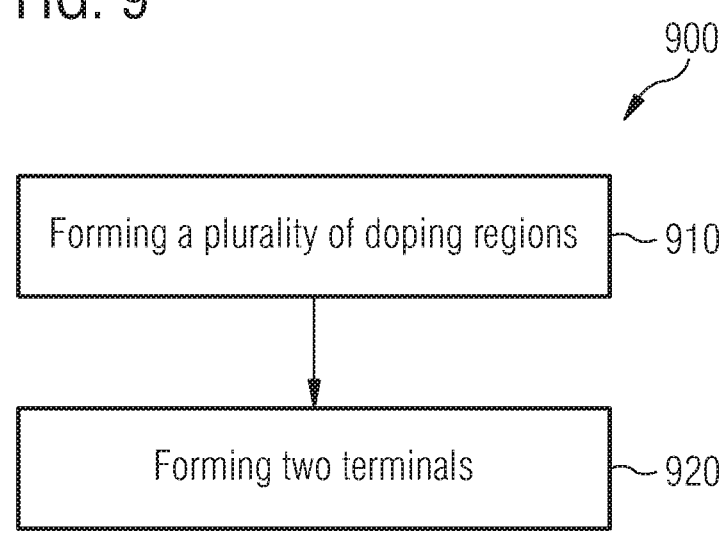
FIG. 9 shows a flow chart of a method for forming a semiconductor device.

More details and aspects are mentioned in connection with the examples described above or below. The examples shown in FIG. 6 may comprise one or more optional additional features corresponding to one or more aspects mentioned in connection with the proposed concept or one or more examples described above (e.g. FIGS. 1 to 5) or below (FIGS. 7 to 9).

Figure 7:
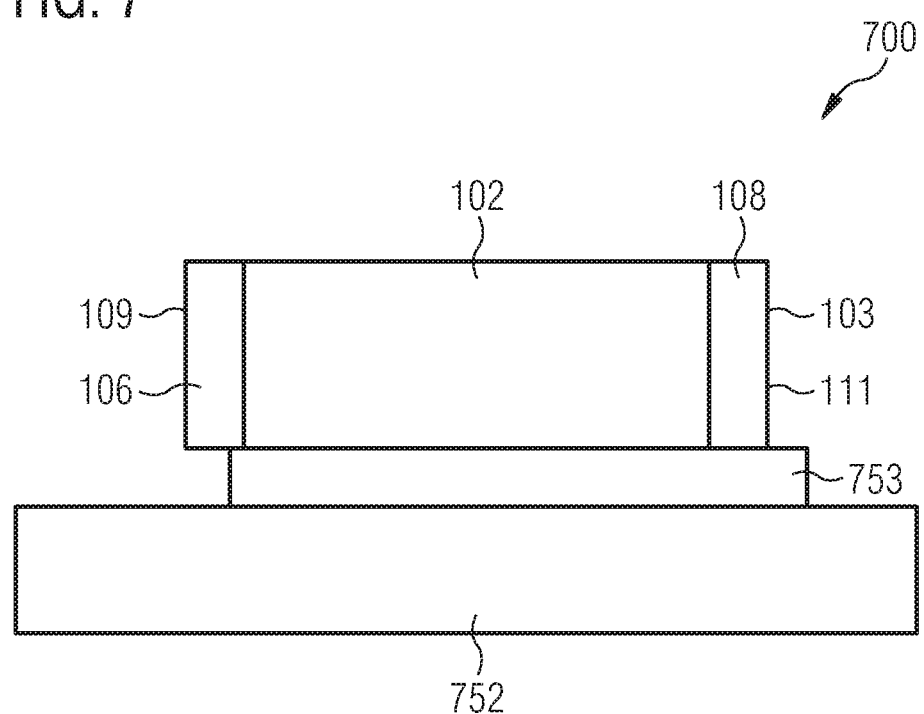
FIG. 7 shows a schematic illustration of a further power semiconductor device including a semiconductor substrate attached to a carrier.

FIG. 7 shows a schematic illustration of a power semiconductor device 700. For example, FIG. 7 shows a schematic illustration of a side view of the power semiconductor device 700.

The power semiconductor device 700 comprises a semiconductor substrate 103, a die pad 752, and a die attach material 753 arranged between the semiconductor substrate 103 and the die pad 752.

The semiconductor substrate 103 comprises at least one power transistor arranged in a power device region 102 of the semiconductor substrate 103. The semiconductor substrate 103 further comprises a first circuit arranged in a first circuit region 106 of the semiconductor substrate 103. The semiconductor substrate 103 further comprises a second circuit arranged in a second circuit region 108 of the semiconductor substrate 103. The first circuit region 106 of the semiconductor substrate 103 is arranged at a first edge 109 of the semiconductor substrate 103. The second circuit region 108 of the semiconductor substrate 103 is arranged at a second edge 111 of the semiconductor substrate 103. The power device region 102 is arranged between the first circuit region 106 and the second circuit region 108.

Due to the first circuit region 106 being arranged between the power device region 102 and the first edge 109 of the semiconductor substrate 103, and the second circuit region 108 being arranged between the power device region 102 and the second edge 111 of the semiconductor substrate 103, improvements (or benefits) for the die attach process may be achieved. For example, even if insufficient material is present at the chip edges, the insufficient (missing) die attach 753 would be under at least one of the first circuit region 106 and the second circuit region 108 (e.g. under the logic areas), instead of under the power device region 102. Thus, during the operation of the power device (e.g. during a conducing state of a power transistor arranged in the power device region 102), a temperature increase would not lead to overheating and/or electrical failure at the device. Additionally, the logic areas do not heat up much. Additionally or optionally, the wetting conditions of the die attach below the logic areas may be less important due to low power dissipation. Additionally or optionally, the logic areas may be arranged on both chips sides and may function as heat capacitors for heat spreading.

The power semiconductor device 700 includes the power device region 102 (e.g. a DMOS region), the first circuit region 106 (e.g. a logic area or region) and the second circuit region 108 (e.g. a logic area or region).

The first circuit region 106 of the semiconductor substrate 103 (e.g. a semiconductor die) may be arranged between the power device region 102 of the semiconductor substrate 103 and the first edge 109 of the semiconductor substrate 103. The second circuit region 108 of the semiconductor substrate 103 may be arranged between the power device region 102 of the semiconductor substrate 103 and the second edge 111 of the semiconductor substrate 103. Additionally, the power device region 102 may be arranged between the first circuit region 106 and the second circuit region 108.

The power semiconductor device 700 may include a carrier 752 (e.g. a die pad). The back side (e.g. a back lateral surface) of the semiconductor substrate 103 may be attached to the carrier 752 via an adhesive material 753 (e.g. a die attach material). The adhesive material 753 may be in contact with the back side of the semiconductor substrate 103 over at least the (entire) lateral area of the power device region 102 and over less than the total lateral area of the semiconductor substrate 103.

More details and aspects are mentioned in connection with the examples described above or below. The examples shown in FIG. 7 may comprise one or more optional additional features corresponding to one or more aspects mentioned in connection with the proposed concept or one or more examples described above (e.g. FIGS. 1 to 6) or below (FIGS. 8 to 9).

FIG. 8 shows a schematic illustration of a power semiconductor device 800. For example, FIG. 8 shows a schematic illustration of a top view of the power semiconductor device 800.

The power semiconductor device 800 comprises one or more power device regions 102 comprising all areas of a semiconductor substrate 103 with current densities larger than 0.1 A per mm$^2$ (or e.g. larger than 0.2 A per mm$^2$, or e.g. larger than 0.3 A per mm$^2$, or e.g. larger than 0.5 A per mm$^2$). A lateral area of the semiconductor substrate occupied by the one or more power device regions is at least 20% of a total lateral area of the semiconductor substrate.

A minimal lateral distance, dp1, between the one or more power device regions and a first edge 109 of the semiconductor substrate 103 is at least 10% of a lateral length of the first edge, 11, of the semiconductor substrate 103.

A minimal lateral distance, dp2, between the one or more power device regions and a second edge 111 of the semiconductor substrate is at least 10% of a lateral length of the first edge, 11, or the second edge, 12, of the semiconductor substrate.

Due to the minimal lateral distance between the one or more power device regions and the first edge 109 and the second edge 111 of the semiconductor substrate 103 being at least 10% of a lateral length of the first edge of the semiconductor substrate 103, heat spreading and/or heat dissipation from the power device region 102 of the semiconductor substrate may be improved. For example, the semiconductor substrate regions between the power device regions and the first edge 109 and the second edge 111 may be used as heat capacitors and/or heat spreaders which may allow higher operation temperatures of the power semiconductor device 800. Due to improved heat spreading and/or heat dissipation away from the power device region 102, reliability of the power semiconductor device 800 may be improved.

A power device region 102 may be a region of the semiconductor substrate 103 with current densities larger than 0.1 A per mm$^2$ (or e.g. larger than 0.2 A per mm$^2$, or e.g. larger than 0.3 A per mm$^2$, or e.g. larger than 0.5 A per mm$^2$). The one or more power device regions 102 may include all areas of a semiconductor substrate 103 with current densities larger than 0.1 A per mm$^2$ (or e.g. larger than 0.2 A per mm$^2$, or e.g. larger than 0.3 A per mm$^2$, or e.g. larger than 0.5 A per mm$^2$). In other words, any area or region of the semiconductor substrate 103 having current densities larger than 0.1 A per mm$^2$ (or e.g. larger than 0.2 A per mm$^2$, or e.g. larger than 0.3 A per mm$^2$, or e.g. larger than 0.5 A per mm$^2$) may be a power device region 102. The current density may be (or may refer to) a current density during a time interval during the conducting state of a power transistor arranged in the power device region 102.

A minimal (or smallest) lateral distance between the each power device region may be at least 10 μm (or e.g. at least 50 μm, or e.g. at least 100 μm). For example, a minimum lateral distance between a source/drain region of a power transistor arranged in the first power device region and a source/drain region of a (closest or nearest) power transistor arranged in a second power device region may be at least 10 m (or e.g. at least 50 μm, or e.g. at least 100 μm).

The minimal (or smallest) lateral distance, dp1, between the power device region 102 and the first edge 109 of the semiconductor substrate 103 may be at least 10% (or e.g. at least 15%, or e.g. at least 20%) of a (maximal or largest) lateral length (e.g. lateral dimension) of the first edge 109 of the semiconductor substrate 103. For example, the minimal (or smallest) lateral distance between the power device region 102 and the first edge 109 of the semiconductor substrate 103 may be a minimal (or smallest) lateral distance between a source/drain doping region of the power transistor 101 of the power device region 102 and the first edge 109 of the semiconductor substrate 103.

The minimal (or smallest) lateral distance, dp2, between the power device region 102 and the second edge 111 of the semiconductor substrate 103 may be at least 10% (or e.g. at least 15%, or e.g. at least 20%) of a (maximal or largest) lateral length (e.g. lateral dimension) of the first edge 109 (and/or second edge 111) of the semiconductor substrate 103. For example, the minimal (or smallest) lateral distance between the power device region 102 and the second edge 111 of the semiconductor substrate 103 may be the minimal (or smallest) lateral distance between a source/drain doping region of the power transistor 101 of the power device region 102 and the second edge 111 of the semiconductor substrate 103.

A minimal (or smallest) lateral distance between any power transistors (e.g. the source/drain regions of the power transistors) arranged in the semiconductor substrate 103 may be at least 10% (or e.g. at least 15%, or e.g. at least 20%) of a (maximal or largest) lateral length (e.g. lateral dimension) of the first edge 109 of the semiconductor substrate 103. For example, all power transistors arranged in the one or more power device regions 102 may be arranged at a minimal (or smallest) lateral distance of at least 10% of the lateral length of the first edge 109 of the semiconductor substrate 103, from each edge of the semiconductor substrate 103.

More details and aspects are mentioned in connection with the examples described above or below. The examples shown in FIG. 8 may comprise one or more optional additional features corresponding to one or more aspects mentioned in connection with the proposed concept or one or more examples described above (e.g. FIGS. 1 to 7) or below (FIGS. 8 to 9).

FIG. 9 shows a flow chart of a method 900 for forming a semiconductor device.

The method 900 comprises forming (910) a plurality of doping regions in a semiconductor substrate. The plurality of doping regions comprises at least one doping region of a power transistor to be formed in a power device region of a semiconductor substrate, at least one doping region of a first circuit to be formed in a first circuit region of the semiconductor substrate, and at least one doping region of a second circuit to be formed in a second circuit region of the semiconductor substrate. The power transistor to be formed is configured to conduct at least a part of a total current between two terminals of the power semiconductor device in the conducting state of the power transistor. The total current conducted between the two terminals of the power semiconductor device through the power device region is at least 250 mA in the conducting state of the power transistor. The first circuit to be formed is configured so that a maximal current conducted by the first circuit is less than 100 mA during the conducting state of the power transistor. The second circuit to be formed is configured so that a maximal current conducted by the second circuit is less than 100 mA during the conducting state of the power transistor.

The first circuit region of the semiconductor substrate is arranged at a first edge of the semiconductor substrate. The second circuit region of the semiconductor substrate is arranged at a second edge of the semiconductor substrate.

The power device region is arranged between the first circuit region and the second circuit region.

The method 900 further comprises forming (920) two terminals connected to the at least one power transistor.

Due to the forming of at least one doping region of a power transistor to be formed in a power device region of a semiconductor substrate, at least one doping region of a first circuit to be formed in a first circuit region of the semiconductor substrate, and at least one doping region of a second circuit to be formed in a second circuit region of the semiconductor substrate, heat spreading and/or heat dissipation from the power device region of the semiconductor substrate may be improved. For example, the first circuit region and the second circuit region may be used as heat capacitors and/or heat spreaders which may allow higher operation temperatures of the power semiconductor device. Due to improved heat spreading and/or heat dissipation away from the power device region by the first circuit region and the second circuit region, reliability of the power semiconductor device may be improved.

The at least one doping region of the power transistor may be a first source/drain doping region, a second source/drain doping region and/or a body region of the power transistor for example. The at least one doping region of the first circuit and of the second circuit may be source/drain doping regions of transistors of the first circuit and of the second circuit and/or body regions of transistors of the first circuit and of the second circuit.

The method 900 may include forming the two terminals connected to the at least one power transistor after forming the at least one doping region of the power transistor, the at least one doping region of the first circuit, and the at least one doping region of the second circuit. For example, forming the two terminals may include forming at least one electrical interconnect connected to a first source/drain doping region of the at least one power transistor and at least one electrical interconnect connected to a second source/drain doping region of the at least one power transistor.

More details and aspects are mentioned in connection with the examples described above or below. The examples shown in FIG. 9 may comprise one or more optional additional features corresponding to one or more aspects mentioned in connection with the proposed concept or one or more examples described above (e.g. FIGS. 1 to 8) or below.

Various examples relate to a SMART chip design for improved heat dissipation and thermal performance. The examples relate to the design of the DMOS/Power area of a SMART device more or less in the center of the die and or more or less symmetrically. The various examples relate to a die attach and chip layout of a power semiconductor device.

The aspects and features (e.g. the power semiconductor device, the at least one power transistor, the two terminals, the conducting state of the power transistor, the power device region, the first circuit, the first circuit region, the second circuit, the second circuit region, the third circuit, the third circuit region, the fourth circuit, the fourth circuit region, the first edge termination region, the second edge termination region, the semiconductor substrate, the dimensions, lengths and areas) mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first". "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
a power transistor arranged in a power device region of a semiconductor substrate;
a first circuit arranged in a first circuit region of the semiconductor substrate; and
a second circuit arranged in a second circuit region of the semiconductor substrate,
wherein the first circuit region is arranged at a first edge of the semiconductor substrate,
wherein the second circuit region is arranged at a second edge of the semiconductor substrate,
wherein the power device region is arranged between the first circuit region and the second circuit region,
wherein the power transistor is configured to conduct at least a part of a total current between two terminals of the power semiconductor device in a conducting state of the power transistor,
wherein the total current conducted between the two terminals of the power semiconductor device through the power device region is at least 250 mA in the conducting state of the power transistor,
wherein the first circuit is configured so that a maximal current conducted by the first circuit is less than 100 mA during the conducting state of the power transistor,
wherein the second circuit is configured so that a maximal current conducted by the second circuit is less than 100 mA during the conducting state of the power transistor.

2. The power semiconductor device of claim 1, wherein a lateral area of the semiconductor substrate occupied by the power device region is at least 20% of a total lateral area of the semiconductor substrate.

3. The power semiconductor device of claim 2, wherein the lateral area of the semiconductor substrate occupied by the power device region occupies a central portion of the lateral area of the semiconductor substrate, wherein the central portion comprises a center point arranged at a center of the semiconductor substrate, and wherein a minimal lateral dimension of the central portion is at least 5% of a lateral length of the first edge or a lateral length of the second edge of the semiconductor substrate.

4. The power semiconductor device of claim 1, wherein a maximal distance between a source/drain doping region of a transistor arranged in the first circuit region and a source/drain doping region of the power transistor arranged in the power device region is less than 10 µm.

5. The power semiconductor device of claim 1, wherein a minimal lateral distance between the power device region and the first edge of the semiconductor substrate is at least 10% of a lateral length of the first edge of the semiconductor substrate, and wherein a minimal lateral distance between the power device region and the second edge of the semiconductor substrate is at least 10% of a lateral length of the first edge of the semiconductor substrate.

6. The power semiconductor device of claim 1, wherein a minimal lateral distance between the power device region and each edge of the semiconductor substrate is at least 10% of a lateral length of the first edge.

7. The power semiconductor device of claim 1, wherein the first circuit and the second circuit each comprises at least one of a gate control circuit configured to generate a gate control signal of the power transistor and a sensor circuit configured to generate a sensor signal indicating a sensed on-chip parameter.

8. The power semiconductor device of claim 1, wherein the second circuit comprises all sensor circuits of the power semiconductor device.

9. The power semiconductor device of claim 1, further comprising an electrical interconnect extending over the power device region to connect the first circuit arranged in the first circuit region to the second circuit arranged in the second circuit region.

10. The power semiconductor device of claim 1, wherein the maximal current conducted by the first circuit is a current conducted by the first circuit between two terminals of the power semiconductor device during the conducting state of the power transistor, and wherein the maximal current conducted by the second circuit is a current conducted by the second circuit between the two terminals of the power semiconductor device during the conducting state of the power transistor.

11. The power semiconductor device of claim 1, further comprising:
a third circuit arranged in a third circuit region of the semiconductor substrate, the third circuit being configured so that a maximal current conducted by the third circuit is less than 100 mA during the conducting state of the power transistor; and
a fourth circuit arranged in a fourth circuit region of the semiconductor substrate, the fourth circuit being configured so that a maximal current conducted by the fourth circuit is less than 100 mA during the conducting state of the power transistor,
wherein the third circuit region is arranged between the power device region and a third edge of the semiconductor substrate,
wherein the fourth circuit region is arranged between the power device region and a fourth edge of the semiconductor substrate.

12. The power semiconductor device of claim 1, wherein the semiconductor substrate further comprises a first edge termination region extending from the power device region to a third edge of the semiconductor substrate and a second edge termination region extending from the power device region to a fourth edge of the semiconductor substrate, wherein no circuits are arranged in the first edge termination region and the second edge termination region.

13. The power semiconductor device of claim 1, wherein the power transistor comprises a plurality of transistor cells connected in parallel, and wherein the power transistor conducts at least 250 mA in the conducting state of the power transistor.

14. The power semiconductor device of claim 1, wherein a breakdown voltage of the power transistor is at least 10 V.

15. The power semiconductor device of claim 1, wherein a breakdown voltage of transistors arranged in the first circuit region and in the second circuit region is less than 10 V.

16. The power semiconductor device of claim 1, wherein a back side of the semiconductor substrate is attached to a carrier via an adhesive material, wherein the adhesive material is in contact with the back side of the semiconductor substrate over at least a lateral area of the power device region and over less than a total lateral area of the semiconductor substrate.

17. The power semiconductor device of claim 1, further comprising a power transistor arranged in an additional power device region of the semiconductor substrate, wherein the power transistor arranged in the additional power device region is configured to conduct at least a part of a total current between two terminals of the power semiconductor device in a conducting state of the power transistor arranged in the additional power device region, and wherein the total current conducted between the two terminals of the power semiconductor device through the additional power device region is at least 250 mA in the conducting state of the power transistor arranged in the additional power device region.

18. A power semiconductor device, comprising:
one or more power device regions comprising all areas of a semiconductor substrate with current densities larger than 0.1 A per mm², 
wherein a lateral area of the semiconductor substrate occupied by the one or more power device regions is at least 20% of a total lateral area of the semiconductor substrate,
wherein a minimal lateral distance between the one or more power device regions and a first edge of the semiconductor substrate is at least 10% of a lateral length of the first edge of the semiconductor substrate,
wherein a minimal lateral distance between the one or more power device regions and a second edge of the semiconductor substrate is at least 10% of a lateral length of the first edge or the second edge of the semiconductor substrate.

19. A power semiconductor device, comprising:
a power transistor arranged in a power device region of a semiconductor substrate;
a first circuit arranged in a first circuit region of the semiconductor substrate; and
a second circuit arranged in a second circuit region of the semiconductor substrate,
wherein the first circuit region is arranged at a first edge of the semiconductor substrate,
wherein the second circuit region is arranged at a second edge of the semiconductor substrate,
wherein the power device region is arranged between the first circuit region and the second circuit region,
wherein a maximal current conducted by the first circuit is a current conducted by the first circuit between two terminals of the power semiconductor device during the conducting state of the power transistor,
wherein a maximal current conducted by the second circuit is a current conducted by the second circuit between the two terminals of the power semiconductor device during the conducting state of the power transistor.

20. A power semiconductor device, comprising:
a power transistor arranged in a power device region of a semiconductor substrate;
a first circuit arranged in a first circuit region of the semiconductor substrate; and
a second circuit arranged in a second circuit region of the semiconductor substrate,
wherein the first circuit region is arranged at a first edge of the semiconductor substrate,
wherein the second circuit region is arranged at a second edge of the semiconductor substrate,
wherein the power device region is arranged between the first circuit region and the second circuit region,
wherein a back side of the semiconductor substrate is attached to a carrier via an adhesive material,
wherein the adhesive material is in contact with the back side of the semiconductor substrate over at least a lateral area of the power device region.

21. A power semiconductor device, comprising:
a power transistor arranged in a power device region of a semiconductor substrate;
a first circuit arranged in a first circuit region of the semiconductor substrate, the first circuit region being arranged at a first edge of the semiconductor substrate;
a second circuit arranged in a second circuit region of the semiconductor substrate, the second circuit region being arranged at a second edge of the semiconductor substrate; and
a power transistor arranged in an additional power device region of the semiconductor substrate,
wherein the power device region is arranged between the first circuit region and the second circuit region,
wherein the power transistor arranged in the additional power device region is configured to conduct at least a part of a total current between two terminals of the power semiconductor device in a conducting state of the power transistor arranged in the additional power device region,
wherein the total current conducted between the two terminals of the power semiconductor device through the additional power device region is at least 250 mA in the conducting state of the power transistor arranged in the additional power device region.

* * * * *